(12) United States Patent
Ishizaka

(10) Patent No.: US 9,540,733 B2
(45) Date of Patent: Jan. 10, 2017

(54) FILM FORMING METHOD, FILM FORMING APPARATUS AND RECORDING MEDIUM

(71) Applicant: TOKYO ELECTRON LIMITED, Tokyo (JP)

(72) Inventor: Tadahiro Ishizaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/697,824

(22) Filed: Apr. 28, 2015

(65) Prior Publication Data

US 2015/0325432 A1 Nov. 12, 2015

(30) Foreign Application Priority Data

May 7, 2014 (JP) ................................. 2014-095887

(51) Int. Cl.

| | |
|---|---|
| *H01L 21/768* | (2006.01) |
| *H01L 21/285* | (2006.01) |
| *H01L 21/02* | (2006.01) |
| *C23C 16/06* | (2006.01) |
| *C23C 16/46* | (2006.01) |
| *C23C 16/455* | (2006.01) |
| *C23C 16/52* | (2006.01) |
| *C23C 16/44* | (2006.01) |

(Continued)

(52) U.S. Cl.
CPC ............... *C23C 16/46* (2013.01); *C23C 16/06* (2013.01); *C23C 16/16* (2013.01); *C23C 16/4412* (2013.01); *C23C 16/45525* (2013.01); *C23C 16/52* (2013.01); *H01L 21/02107* (2013.01); *H01L 21/28556* (2013.01); *H01L 21/76843* (2013.01); *H01L 21/76876* (2013.01); *H01L 23/53238* (2013.01); *H01L 2924/0002* (2013.01)

(58) Field of Classification Search
CPC .... C23C 16/46; C23C 16/52; C23C 16/45525; C23C 16/4412; C23C 16/06; H01L 23/53238; H01L 21/3205; H01L 21/285; H01L 21/768; H01L 21/28; H01L 23/532; H01L 21/02107
USPC ......................................................... 438/758
See application file for complete search history.

(56) References Cited

U.S. PATENT DOCUMENTS 6,013,584 A * 1/2000 M'Saad ................ C23C 16/401
257/E21.275
2015/0240344 A1* 8/2015 Ishizaka ............ H01L 21/76867
438/653

FOREIGN PATENT DOCUMENTS

| JP | 11-340226 A | 12/1999 |
|---|---|---|
| JP | 2002-60944 A | 2/2002 |

(Continued)

*Primary Examiner* — Caleen Sullivan
(74) *Attorney, Agent, or Firm* — Nath, Goldberg & Meyer; Jerald L. Meyer

(57) ABSTRACT

A film forming method in which in a state in which a target substrate is loaded on a loading table body of a loading table installed in a processing container and an interior of the processing container is evacuated, a film forming material gas is supplied into the processing container while heating the target substrate with a heater installed in the loading table body, to be thermally decomposed or reacted on a surface of the target substrate to form a predetermined film on the target substrate, includes introducing a heat transfer gas containing an $H_2$ gas or an He gas into the processing container to transfer heat of the loading table body to a radially outer side of the loading table body, before the film forming material gas is supplied.

8 Claims, 14 Drawing Sheets

(51) Int. Cl.
*H01L 23/532* (2006.01)
*C23C 16/16* (2006.01)

(56) References Cited

FOREIGN PATENT DOCUMENTS

| | | |
|---|---|---|
| JP | 2004-346401 A | 12/2004 |
| JP | 2007-194624 A | 8/2007 |
| JP | 2009-239104 A | 10/2009 |
| KR | 10-2004-0091784 A | 10/2004 |
| KR | 10-2009-0031582 A | 3/2009 |

* cited by examiner

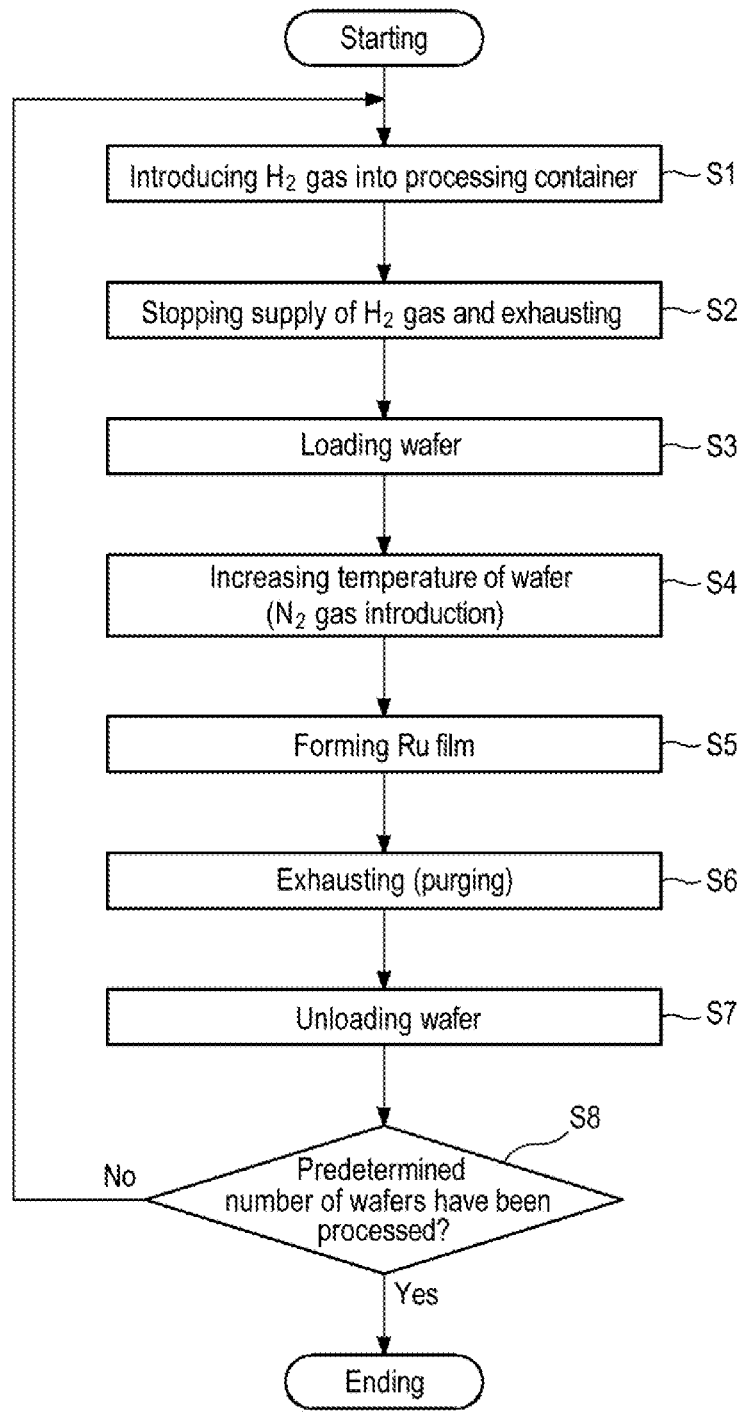

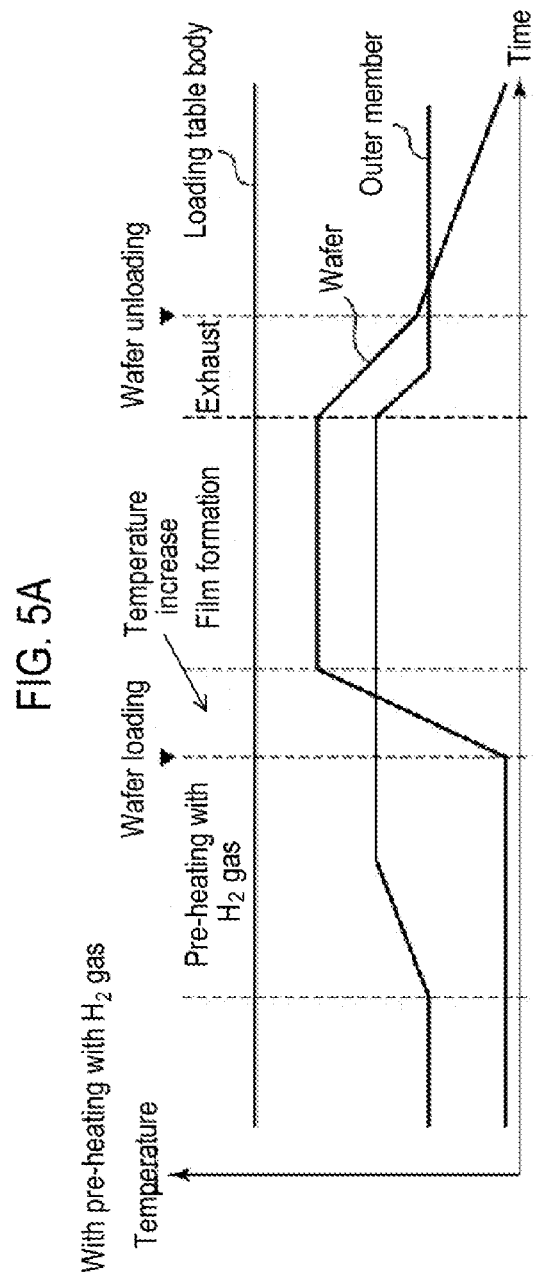

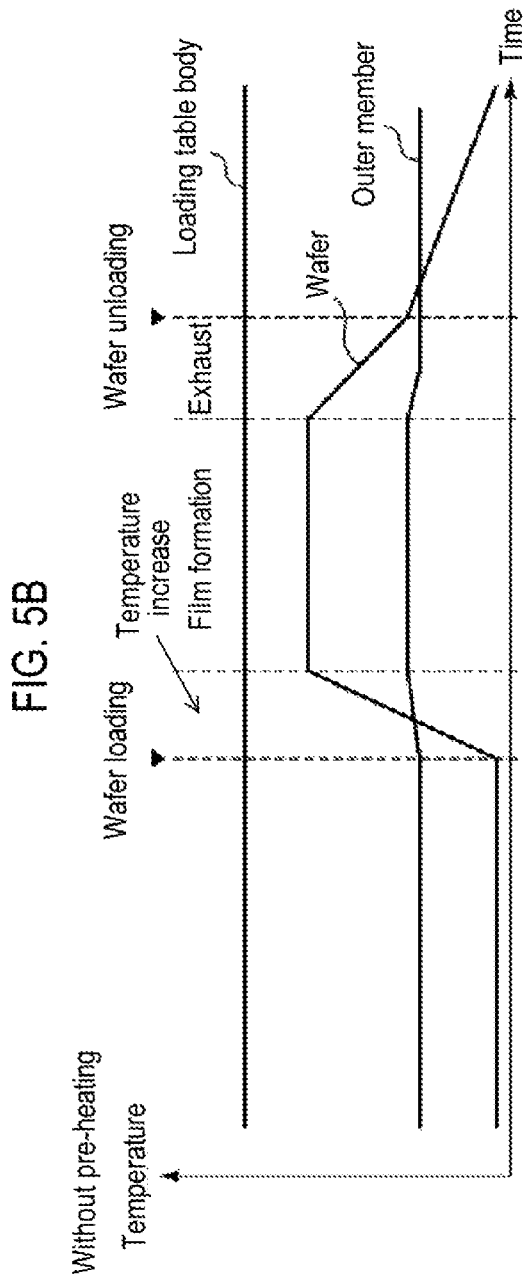

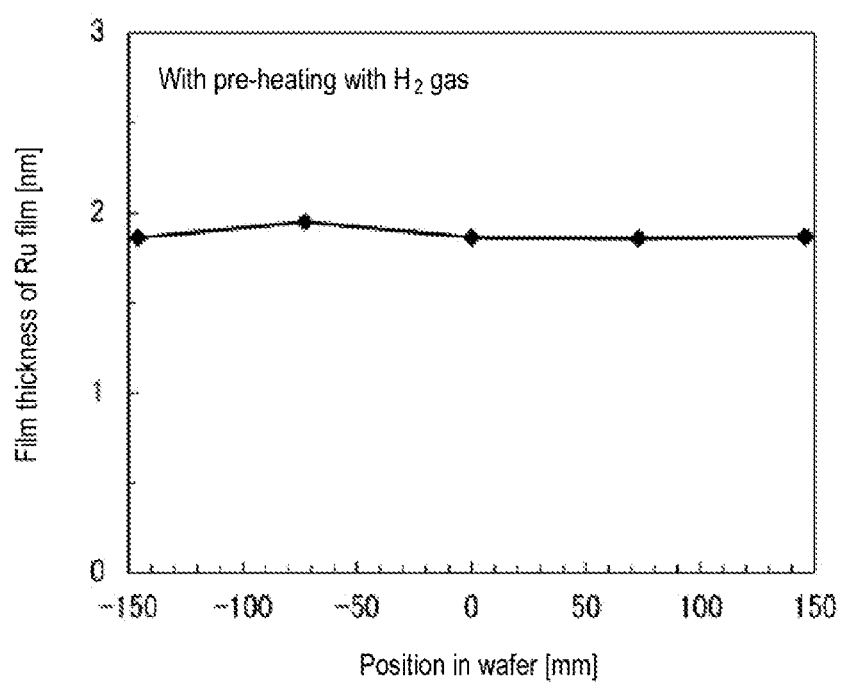

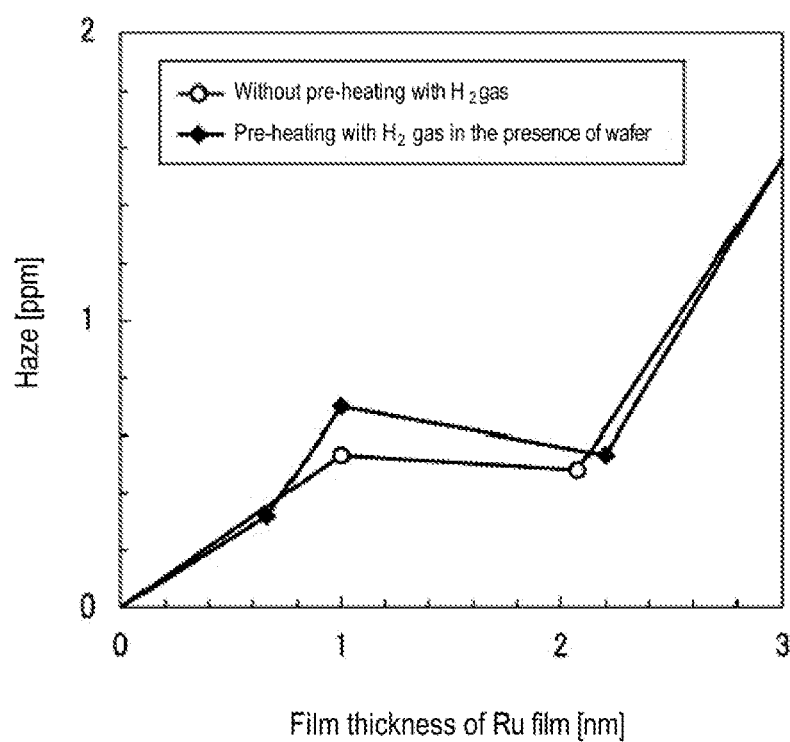

FILM FORMING METHOD, FILM FORMING APPARATUS AND RECORDING MEDIUM

CROSS-REFERENCE TO RELATED APPLICATION

This application claims the benefit of Japanese Patent Application No. 2014-095887, filed on May 7, 2014, in the Japan Patent Office, the disclosure of which is incorporated herein in its entirety by reference.

TECHNICAL FIELD

The present disclosure relates to a film forming method of forming a predetermined film on a substrate to be processed, and a film forming apparatus.

BACKGROUND

Recently, demand for high speed semiconductor devices, scaling-down of wiring patterns, and high integration have spurred a reduction in inter-wiring capacitance, enhancement of conductivity of wirings, and enhancement of electromigration tolerance. As a technology for meeting the above requirements, a copper (Cu) multilayer wiring technology has been drawing attention, in which a film of a low dielectric constant (a low-k film) as an interlayer insulating film, and copper as a wiring material which has conductivity higher than that of aluminum (Al) or tungsten (W) and good electromigration tolerance are used.

As one of the methods of forming a copper wiring, a technology of first forming a low-k film on a semiconductor wafer (hereinafter, simply referred to as "wafer") as a substrate to be processed, forming a trench or a hole in the low-k film, forming a barrier layer made of Ta, TaN, Ti, or the like on an inner wall thereof through physical vapor deposition (PVD) represented by sputtering, forming a copper seed layer thereon through PVD, and performing copper plating thereon to bury the trench or the hole has been known.

However, since the design rule of semiconductor devices has become increasingly scaled down, it is difficult to form a copper seed layer within a trench or a hole through PVD having essentially low step coverage. Thus, a method of forming a ruthenium film as a seed layer on a barrier layer through chemical vapor deposition (CVD) and forming a copper film thereon has been proposed. Further, forming a ruthenium film through atomic layer deposition (ALD) capable of obtaining better step coverage has also been considered. Moreover, forming the barrier layer through CVD or ALD has also been considered.

In the case of forming the seed layer or the barrier layer through CVD or ALD, an organic metal compound in which a metal atom is bonded with an organic group is normally used. However, the use of an organic metal compound leads to a problem that components other than a metal easily remain in a film. Thus, using metal carbonyl is discussed as an organic metal compound raw material since it allows for obtaining a film with less impurities and the only organic ligand thereof is CO. A technology of forming a tungsten film as a barrier layer using $W(CO)_6$ and a technology of forming a ruthenium film as a seed layer using $Ru_3(CO)_{12}$ have been known.

However, in a normal film forming method in which a film is formed using metal carbonyl, a film thickness in a central portion of a wafer tends to be greater while a film thickness in a peripheral portion tends to be smaller, resulting in low in-plane uniformity. For this reason, a method of installing a baffle plate having a gas outlet in a position corresponding to a periphery of a semiconductor wafer, further installing an annular inner partition wall surrounding a processing space within a processing container, and supplying a film forming material gas from the gas outlet installed in the periphery of the baffle plate toward a region positioned radially-outwardly than an outer circumferential end of the semiconductor wafer loaded on a loading table has been proposed in the related art.

When scaling-down of semiconductor devices further progresses and it becomes an era of post-22-nm node technology, a uniformly formed barrier layer or a seed layer with an extremely small film thickness of 2 nm or less will be required. However, even when the technology of the related art is used, in-plane uniformity of a desired film thickness may not be obtained due to the little temperature difference between a central portion and a peripheral portion of a wafer. Consequently, a different way or approach to secure the desired in-plane uniformity is required.

SUMMARY

Some embodiments of the present disclosure provide a film forming method and a film forming apparatus by which a film with good thickness uniformity can be formed.

According to one embodiment of the present disclosure, provided is a film forming method in which in a state in which a target substrate is loaded on a loading table body of a loading table installed in a processing container and an interior of the processing container is evacuated, a film forming material gas is supplied into the processing container while heating the target substrate with a heater installed in the loading table body, to be thermally decomposed or reacted on a surface of the target substrate to form a predetermined film on the target substrate, including introducing a heat transfer gas containing an $H_2$ gas or an He gas into the processing container to transfer heat of the loading table body to a radially outer side of the loading table body, before the film forming material gas is supplied.

According to one embodiment of the present disclosure, provided is a film forming apparatus for forming a predetermined film on a surface of a target substrate, including: a processing container configured to accommodate the target substrate, a loading table including a loading table body on which the target substrate is loaded in the processing container, a heater installed in the loading table body, a film forming material gas supply unit configured to supply a film forming material gas into the processing container, a heat transfer gas introduction unit configured to introduce a heat transfer gas containing an $H_2$ gas or an He gas into the processing container, an exhaust unit configured to evacuate an interior of the processing container, and a control unit configured to perform controlling to supply the film forming material gas into the processing container while heating the target substrate on the loading table body by the heater, and to allow the film forming material gas to be thermally decompose or react on a surface of the target substrate to form the predetermined film on the target substrate, and controlling to introduce the heat transfer gas containing an $H_2$ gas or an He gas into the processing container to transfer heat of the loading table body to a radially outer side of the loading table body, prior to supplying the film forming material gas.

According to one embodiment of the present disclosure, provided is a non-transitory computer-readable recording medium storing a program that operates on a computer to control a film forming apparatus, wherein, when executed, the program controls the firm forming apparatus on the computer such that the aforementioned method is performed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a flowchart illustrating an example of a film forming method according to the present disclosure.

FIGS. 5A and 5B are views illustrating changes in temperatures of a loading table body, an outer member, and a wafer in the film forming method according to an embodiment of the present disclosure and the conventional film forming method.

FIGS. 7A and 7B are views illustrating results of measuring a film thickness distribution in the diameter direction of the wafer when the Ru film was formed to have a film thickness of about 2 nm, wherein FIG. 7A shows a case where the Ru film was pre-heated with the $H_2$ gas and FIG. 7B shows a case without pre-heating.

FIG. 8 is a view illustrating a relationship between a film thickness and Haze value of the Ru film in a case where the Ru film was formed by introducing the $H_2$ gas in the presence of a wafer and in a case using a conventional method without introducing the $H_2$ gas.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The inventors have continued to conduct a research to solve the above mentioned problem and found that the conventional film forming apparatuses had a limited in-plane uniformity of a film thickness due to a temperature difference between a central portion and a peripheral portion of the substrate to be processed, which unavoidably occurs in a vacuum atmospheric processing container since a member not heated is installed on an outer side of a loading table on which the substrate is loaded. The inventors further found that the temperature difference between the central portion and the peripheral portion of the substrate can be reduced by introducing a heat transfer gas having high thermal conductivity into the processing container to accelerate heat transfer from the loading table to the outer member, and thus completed the present disclosure.

<Film Forming Apparatus>

Figure 1:
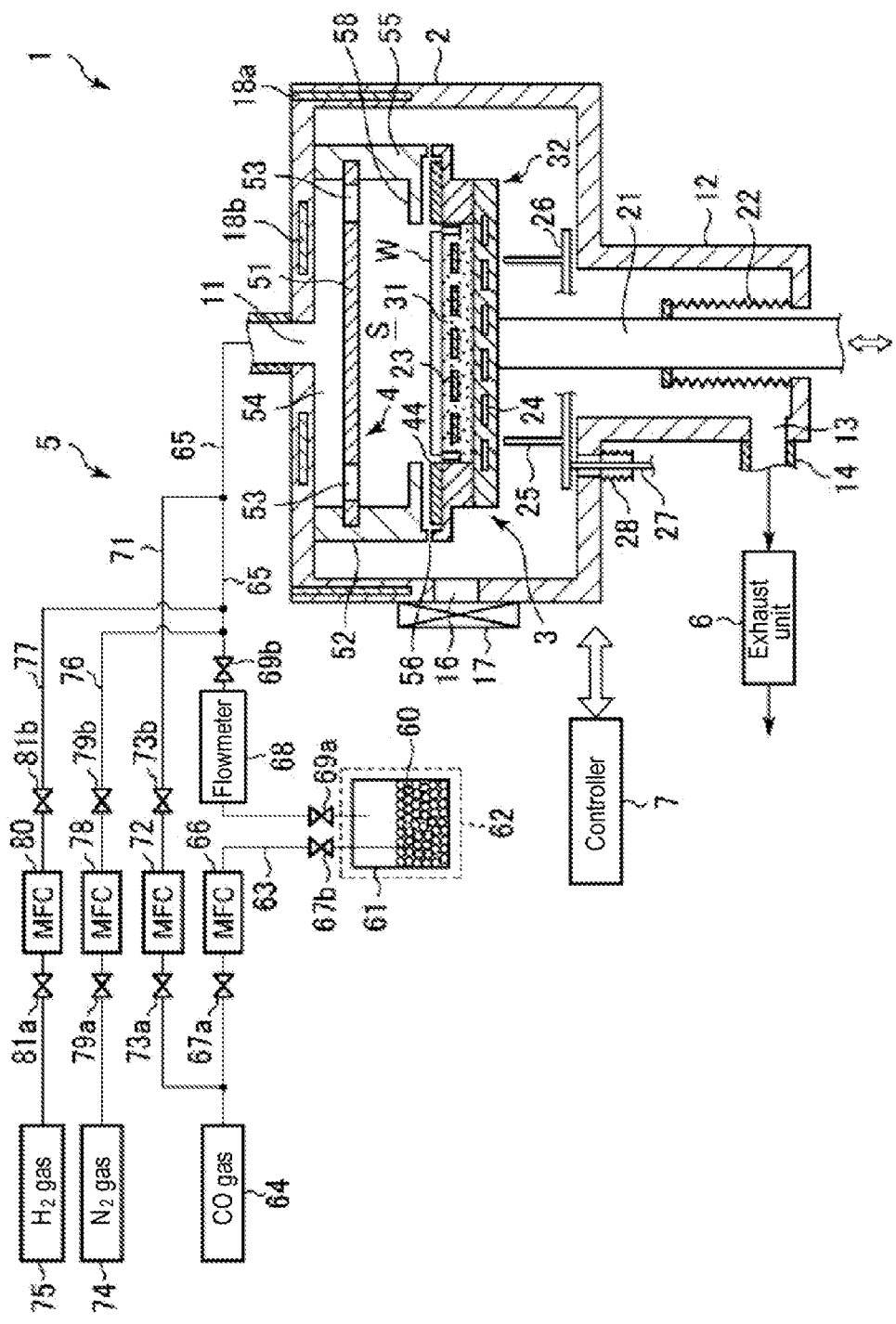
FIG. 1 is a sectional view illustrating an example of a film forming apparatus for performing a film forming method according to one embodiment of the present disclosure.
Figure 2:
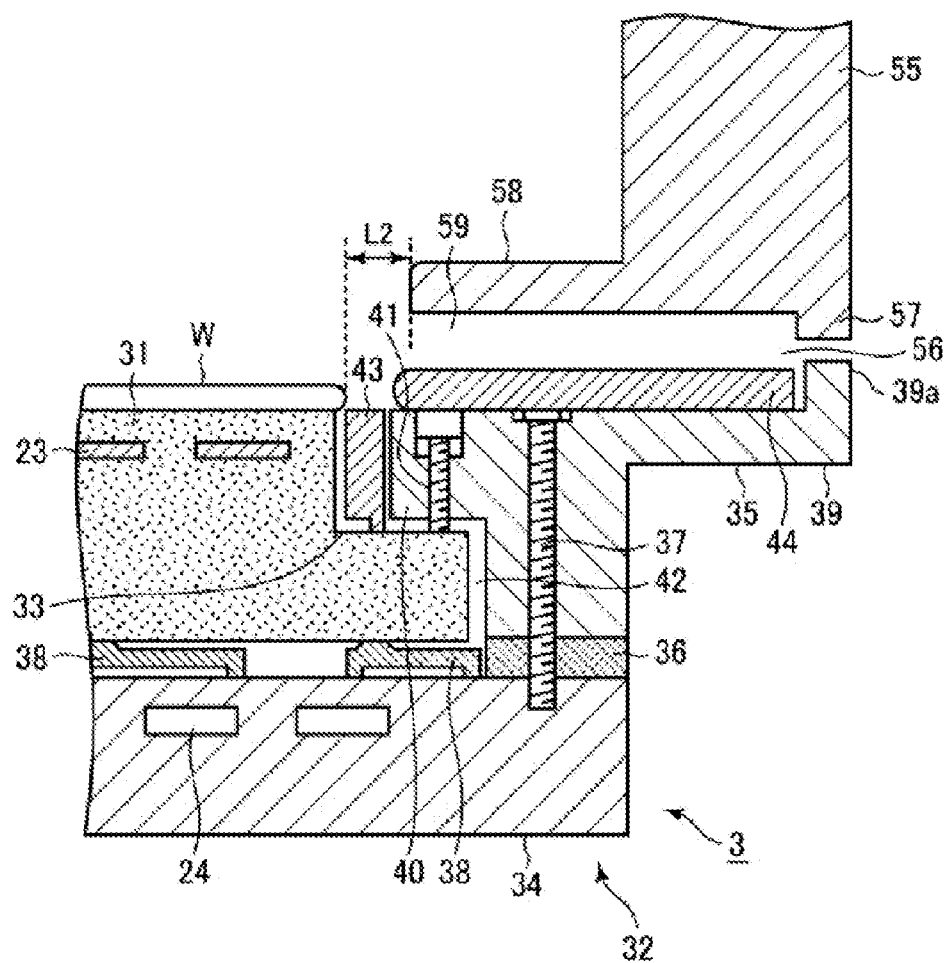
FIG. 2 is a partial sectional view illustrating details of a major part of a loading table in the film forming apparatus shown in FIG. 1.
Figure 3:
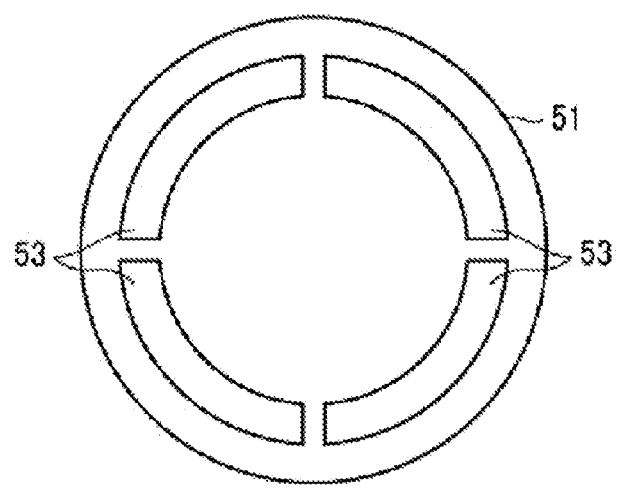
FIG. 3 is a plan view illustrating an example of a baffle plate used in the film forming apparatus shown in FIG. 1.

FIG. 1 is a sectional view illustrating an example of a film forming apparatus to perform a film forming method according to an embodiment of the present disclosure, FIG. 2 is a partial sectional view illustrating details of a major part of a loading table, and FIG. 3 is a plan view illustrating an example of a baffle plate used in the film forming apparatus shown in FIG. 1. Here, a case in which a ruthenium film is formed using $Ru_3(CO)_{12}$, which is a carbonyl-based organic metal compound as a raw material of an organic metal compound, will be described as an example.

As illustrated in FIG. 1, a film forming apparatus 1 according to a first embodiment of the present disclosure has a processing container 2 having a substantially cylindrical shape and defining a processing chamber. The processing container 2 is formed of, e.g., aluminum or an aluminum alloy. An exhaust container 12 having a cylindrical shape having a diameter smaller than that of the processing container 2 and defining an exhaust chamber is connected to a lower wall of the processing container 2 to protrude downwardly. The exhaust container 12 is formed of the same material as that of the processing container 2.

An exhaust port 13 is formed through a lower portion of a sidewall of the exhaust container 12 and an exhaust pipe 14 is connected to the exhaust port 13. An exhaust unit 6 having a vacuum pump, a pressure control value, and the like is connected to the exhaust pipe 14. Further, the interior of the processing container 2 may be depressurized (vacuumized) to a predetermined vacuum state by operating the exhaust unit 6.

Horizontally installed inside the processing container 2 is a loading table 3 on which a wafer W as a target object to be processed is loaded to be kept and supported. The loading table 3 is fixedly installed on an upper end of a metal support column 21 vertically extending from a lower side of the exhaust container 12. The support column 21 extends downwardly to penetrate through a lower portion of the exhaust container 12, and is lifted or lowered by an actuator (not shown) to lift or lower the entire loading table 3. Further, an extensible and contractible metal bellows 22 is installed in a portion of the lower portion of the exhaust container 12 through which the support column 21 penetrates, so that the loading table 3 can be lifted or lowered while maintaining airtightness of the interior of the processing container 2.

A heater 23 such as a tungsten wire heater or a carbon wire heater is embedded in the loading table 3, and the wafer W is heated by the heater 23. Further, a coolant passage 24 configured to flow a coolant to cool a lower portion or a side portion of the loading table 3 for a temperature adjustment is installed in the loading table 3. A detailed configuration of the loading table 3 will be described later.

A plurality of pin insertion through holes (not shown; e.g., three) is vertically formed through a peripheral portion of the loading table 3 and lifter pins 25 can be inserted into the respective pin insertion through holes. A lower end of each of the lifter pins 25 is supported by a lifting arm 26 and the lifting arm 26 is connected to a lifting rod 27 that penetrates through the lower portion of the processing container 2. Further, the lifter pin 25 can be lifted or lowered through the lifting arm 26 when the lifting rod 27 is lifted or lowered by an actuator (not shown). Accordingly, the lifter pin 25 can protrude or retreat with respect to a loading surface of the loading table 3 to push up the wafer W from the loading table 3 or to allow the wafer W transferred onto the protruding lifter pin 25 to be loaded on the loading surface of the loading table 3. Airtightness is kept in a portion of the lower portion of the processing container 2 through which the lifting rod 27 penetrates by the bellows 28.

A gas introduction hole 11 through which a film forming gas is introduced into the processing container 2 is formed in a central portion of a ceiling of the processing container 2. A gas supply pipe of a gas supply unit 5 which supplies the film forming gas is connected to the gas introduction hole 11. Further, a gas introduction unit 4 in communication with the gas introduction hole 11 is installed in an upper portion of the processing container 2. Also, a detailed configuration of the gas introduction unit 4 and the gas supply unit 5 will be described later.

An opening 16 is formed through a sidewall of the processing container 2 in a position corresponding to a lower position of the loading table. The wafer W is loaded or unloaded by a transfer arm (not shown) through the opening 16. A gate valve 17 is installed to open and close the opening 16.

Heaters 18a and 18b are installed on a sidewall and a ceiling wall of the processing container 2, respectively, to heat the sidewall and the ceiling wall to a predetermined temperature in order to prevent a film forming material gas supplied into the processing container 2 from being solidified or liquefied.

The film forming apparatus 1 includes a controller 7 for controlling components such as a heater power supply, the exhaust unit 6, and the gas supply unit 5. The controller 7 controls the components according to a command from a higher control device. The higher control device includes a storage medium that stores a processing recipe for implementing the film forming method described later, and controls film forming processes based on the processing recipe stored in the storage medium.

The loading table 3 has a disk shape in its entirety. As illustrated in FIG. 2, the loading table 3 mainly includes a loading table body 31 on which the wafer W is loaded and a base 32 that supports the loading table body 31 while surrounding a side surface and a bottom surface of the loading table body 31.

The loading table body 31 is formed of ceramics or a metal, has a disk shape, and has the heater 23 embedded in the loading table body 31 across substantially the entire surface in an insulated state. An upper surface of the loading table body 31 is a loading surface on which the wafer W is loaded, and the wafer W is heated to a desired temperature through the loading table body 31 by feeding the heater 23, for temperature control of the wafer W.

As ceramics to form the loading table body 31, for example, an aluminum nitride (AlN), an aluminum oxide ($Al_2O_3$), a silicon carbide (SiC), or the like may be used, and as a metal to form the loading table body 31, aluminum, an aluminum alloy, or the like may be used. A diameter of the loading table body 31 is set to be slightly smaller than that of the wafer W. An upper portion of the loading table body 31 includes an end portion 33 cut into a right angle shape, which forms a ring shape along a circumferential direction.

The base 32 is entirely formed of a metal. Further, the base 32 includes a base member 34 through which the coolant passages 24 are formed across substantially the entire surface. The base member 34 has a disk shape and is made of a metal. The base 32 also includes an edge ring 35 formed in a peripheral portion of the base member 34 to surround the circumferential surface of the loading table body 31. The edge ring 35 has a ring shape and is made of a metal. When a coolant is flown to the coolant passage 24 through a pipe (not shown), a temperature is kept in a temperature range lower than a decomposition temperature of the film forming material gas and equal to or higher than a solidification temperature or a liquefaction temperature of the film forming material gas.

A ring-shaped thermal conduction alleviation member 36 formed of a metal having low thermal conductivity is interposed between the base member 34 and the edge ring 35 in order to alleviate cooling of the edge ring 35. Specifically, the base member 34 and the edge ring 35 are formed of aluminum or an aluminum alloy, and the thermal conduction alleviation member 36 is formed of stainless steel having thermal conductivity lower than that of aluminum or the aluminum alloy. The thermal conduction alleviation member 36 is installed if necessary and may be omitted. Also, the base member 34 and the edge ring 35 may be formed of stainless steel. The edge ring 35, the thermal conduction alleviation member 36, and the base member 34 are detachably (separately) coupled together by a plurality of bolts 37.

A heat insulating material 38 formed of, e.g., ceramics or stainless steel is installed between an upper surface of the base member 34 of the base 32 and a lower surface of the loading table body 31.

The edge ring 35 has a ring-shaped flange portion 39 that maintains the same level as a horizontal level of the loading surface of the wafer W and extends radially outwardly from the wafer W. A protrusion 39a that protrudes upwardly from a peripheral portion of the flange portion 39 is formed to have a circular shape.

A protrusion 40 protrudes toward the loading table body 31 from an upper portion of the edge ring 35 on the inner circumferential side thereof and is formed to have a ring shape in a circumferential direction. The protrusion 40 extends up to the middle of an end portion 33 of the loading table body 31. A plurality of screw holes are vertically formed through the protrusion 40 along a circumferential direction and fixing screws 41 are coupled with the screw holes, respectively. When the fixing screws 41 are moved downward, a peripheral portion of the loading table body 31 is pressed to be fixed. Further, an inner circumferential surface of the edge ring 35 and an outer circumferential surface of the loading table body 31 are not in direct contact with each other, forming a space portion 42 therebetween.

A ring-shaped shield ring 43 is loosely inserted between a side surface of the end portion 33 of the loading table body 31 and an inner circumferential surface of the protrusion 40 of the edge ring 35. The shield ring 43 is detachably installed. The shield ring 43 is formed of a metal such as aluminum or an aluminum alloy and has functions such as preventing a film from being formed on a sidewall of the loading table body 31, securing temperature in-plane uniformity of the wafer W, preventing a film from being formed on a rear surface of the wafer W, thermally insulating the loading table body 31 from the edge ring 35, and like.

A ring-shaped cover ring 44 for preventing a film from being attached to a bevel portion which is an end surface of the wafer W is installed on an upper surface of the edge ring 35. The cover ring 44 is formed of, e.g., ceramics such as alumina or an aluminum nitride. Like the base 32, a temperature of the cover ring 44 is maintained to be lower than the decomposition temperature of the film forming material gas and equal to or higher than the solidification temperature or liquefaction temperature of the film forming material gas.

The gas introduction unit 4 communicates with the gas introduction hole 11 formed in the central portion of the ceiling of the processing container 2, is installed to face the loading table 3, and supplies a film forming material gas from a position above the loading table 3 toward a region of the loading table 3 positioned more radially outward than a peripheral end of the wafer on the loading table 3. Thus, the gas introduction unit 4 supplies the film forming material gas in a direction toward the region positioned more radially outward than the wafer W loaded on the loading table, avoiding the wafer W.

Specifically, the gas introduction unit 4 has a baffle plate 51 having a diameter greater than that of the wafer W. The baffle plate 51 is supported by a support member 52 having a circular ring shape extending downwardly from an inner surface of the ceiling of the processing container 2 such that it is spaced apart from the ceiling by an appropriate length and faces the wafer W on the loading table 3. As illustrated in FIG. 3, a plurality of gas discharge holes 53 having a circular arc shape are formed through a peripheral portion of the baffle plate 51 along a circumferential direction. The plurality of gas discharge holes 53 is positioned to correspond to the region of the loading table 3 positioned more outward than the peripheral end of the wafer W on the loading table 3. A portion between the ceiling of the processing container 2 and the baffle plate 51 is formed as a diffusion chamber 54 in which the film forming material gas is diffused. The film forming material gas diffused outwardly in the diffusion chamber 54 is discharged toward a lower processing space through the gas discharge holes 53. Further, instead of the gas discharge holes 53 having such a circular arc shape, a plurality of gas injection holes having a small inner diameter may be formed in the circumferential direction.

The support member 52 or the baffle plate 51 is formed of a metal material having good thermal conductivity, e.g., aluminum or an aluminum alloy.

Integrally formed with a lower portion of the support member 52 is a ring-shaped inner partition wall 55 which is a portion that extends vertically downward from the support member 52 in a lower side of the support member 52. The ring-shaped inner partition wall 55 is formed of the same material as that of the support member 52. The inner partition wall 55 is installed to surround the processing space S above the loading table 3, and a lower end portion thereof is in the vicinity of the loading table 3. Further, an annular exhaust gas outlet 56 is formed between a lower end of the inner partition wall 55 and the peripheral portion of the loading table 3 in a circumferential direction of the loading table 3. By the gas outlet 56, an atmosphere of the processing space S is equally evacuated from the outer circumference side of the wafer W.

The inner partition wall 55 is positioned above the flange portion 39 and the cover ring 44 positioned in the peripheral portion of the loading table 3, and the gas outlet 56 is formed between an upper surface of the cover ring 44 and an upper surface of the protrusion 39a of the flange portion 39 and a lower end surface of the inner partition wall 55. A ring-shaped protrusion 57 is formed on a lower end portion of the inner partition wall 55 in the circumferential direction to correspond to the protrusion 39a of the flange portion 39, reducing a width of a flow path on the outer circumference side of the gas outlet 56. A vertical width of the gas outlet 56 including a portion of the outer peripheral portion in which the flow path is reduced, ranges from 1 to 10 mm.

An orifice forming member 58 is installed in a lower end portion of the inner partition wall 55. Specifically, the orifice forming member 58 extends from a lower end portion of the inner partition wall 55 toward an inner side of the radial direction of the loading table 3, namely, toward the center of the processing container 2, and has a ring shape along the circumferential direction of the loading table 3. Further, an orifice portion 59 is formed between a lower surface of the orifice forming member 58 and the peripheral portion of the loading table 3 to communication with the gas outlet 56. Thus, the orifice portion 59 is defined between the lower surface of the orifice forming member 58 and the upper surface of the cover ring 44 disposed in the peripheral portion of the loading table 3, to have a ring shape along the circumferential direction of the loading table 3.

The orifice forming member 58 is formed of the same material having good thermal conductivity as that of the inner partition wall 55. Although the orifice forming member 58 is integrally formed with the inner partition wall 55, it may be formed separately. Since the orifice forming member 58 extends toward the center of the processing container 2 in this manner, it can change a flow direction of a part of the film forming material gas that flows downward from an upper side toward the center of the processing container 2 and, at the same time, narrow a flow path area of a gas exhausted through the orifice portion 59, thereby appropriately increasing a retention time of the film forming material gas in the processing space S.

In this case, in some embodiments, an inner circumferential end of the orifice forming member 58 is formed not to extend radially inwardly beyond the outer circumferential end of the wafer W loaded on the loading table 3. If the inner circumferential end of the orifice forming member 58 extends up to a space above the wafer W, in-plane uniformity of the film thickness may deteriorate. Further, in order to secure the orifice forming member 58, a horizontal distance (L2 in FIG. 2) between the inner circumferential end of the orifice forming member 58 and the outer circumferential end of the wafer W loaded on the loading table 3 is 10 mm or smaller in some embodiments. In addition, a vertical width of the orifice portion 59 is set to be substantially equal to the width of the gas outlet 56.

The gas supply unit 5 has a film forming material container 61 that accommodates ruthenium carbonyl ($Ru_3(CO)_{12}$) as a film forming material 60 in a solid state. A heater 62 is installed near the film forming material container 61. A carrier gas supply pipe 63 for supplying a CO gas as a carrier gas from an upper side is inserted into the film forming material container 61. A CO gas supply source 64 for supplying a CO gas is connected to the carrier gas supply pipe 63. Further, a film forming material gas supply pipe 65 is inserted into the film forming material container 61. The gas supply pipe 65 is connected to the gas introduction hole 11 of the processing container 2. Thus, a CO gas as a carrier gas is blown into the film forming material container 61 from the CO gas supply source 64 through the carrier gas supply pipe 63, and the ruthenium carbonyl (Ru$_3$(CO)$_{12}$) gas sublimated within the film forming material container 61 is transferred by the CO gas to be introduced into the diffusion chamber 54 of the gas introduction unit 4 through the film forming material gas supply pipe 65 and the gas introduction hole 11. Finally, the ruthenium carbonyl gas is supplied to the processing space S of the processing container 2 from the gas discharge hole 53 of the baffle plate 51. A mass flow controller 66 for controlling a flow rate and valves 67a and 67b positioned before and after the mass flow controller 66 are installed in the carrier gas supply pipe 63. Further, a flow meter 68 for detecting an amount of the ruthenium carbonyl (Ru$_3$(CO)$_{12}$) gas and valves 69a and 69b positioned before and after the flow meter 68 are installed in the gas supply pipe 65.

Additionally, the gas supply unit 5 has a counter CO gas pipe 71 branched from an upstream side of the valve 67a in the carrier gas supply pipe 63. The counter CO gas pipe 71 is connected to the gas supply pipe 65. Thus, a CO gas can be supplied to the processing space S, apart from the ruthenium carbonyl gas, from the CO gas supply source 64. A mass flow controller 72 for controlling a flow rate and valves 73a and 73b positioned before and after the mass flow controller 72 are installed in the counter CO gas pipe 71.

Also, the gas supply unit 5 has an N$_2$ gas supply source 74 for supplying an N$_2$ gas used as a dilution gas, a temperature increasing gas, and a purge gas, and an H$_2$ gas supply source 75 for supplying an H$_2$ gas used as a heat transfer gas. One end of an N$_2$ gas supply pipe 76 is connected to the N$_2$ gas supply source 74, and one end of an H$_2$ gas supply pipe 77 is connected to the H$_2$ gas supply source 75, and the other ends thereof are connected to the film forming material gas supply pipe 65. A mass flow controller 78 for controlling a flow rate and valves 79a and 79b positioned before and after the mass flow controller 78 are installed in the N$_2$ gas supply pipe 76 whereas a mass flow controller 80 for controlling a flow rate and valves 81a and 81b positioned before and after the mass flow controller 80 are installed in the H$_2$ gas supply pipe 77.

Further, an Ar gas may be used instead of the N$_2$ gas used as a dilution gas. Also, an He gas may be used instead of the H$_2$ gas as a heat transfer gas.

<Film Forming Method>

Next, a film forming process performed using the film forming apparatus 1 configured as described above will be described.

For the film forming process, the gate valve 17 is open and the wafer W is loaded into the processing container 2 through the opening 16 and loaded on the loading table 3, and the interior of the processing container 2 is evacuated by the exhaust unit 6 to be maintained at a predetermined pressure, and a temperature of the wafer W on the loading table 3 is increased by the heater 23.

Subsequently, the valves 67a and 67b of the gas supply unit 5 are opened, a CO gas as a carrier gas is blown into the film forming material container 61 through the carrier gas supply pipe 63, and a Ru$_3$(CO)$_{12}$ gas sublimated through heating by the heater 62 in the film forming material container 61 is supplied together with a CO gas as a carrier gas to the diffusion chamber 54 of the gas introduction unit 4 via film forming material gas supply pipe 65 and the gas introduction hole 11. Further, the supplied film forming material gas is introduced to the processing space S of the processing container 2 through the gas discharge hole 53 of the baffle plate 51. The Ru$_3$(CO)$_{12}$ gas as a film forming material gas is thermally decomposed by a reaction expressed by Equation (1) below to generate ruthenium (Ru), and the generated ruthenium (Ru) is deposited on the surface of the wafer W to form a Ru film having a predetermined film thickness.

$$Ru_3(CO)_{12} \rightarrow 3Ru + 12CO \qquad \text{Equation (1)}$$

At this time, adsorption and desorption reaction of Ru$_3$(CO)$_{12}$ and CO as expressed by Equation (2) below occurs on the surface of the wafer. This reaction is thought to be a reaction of surface reaction rate control capable of obtaining good step coverage when a film is formed in a recess portion such as a trench or a hole, and the adsorption and desorption reaction of Ru$_3$(CO)$_{12}$ and CO is considered as an equilibrium reaction.

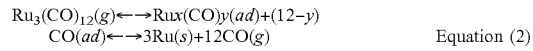

$$Ru_3(CO)_{12}(g) \leftrightarrow Ru_x(CO)_y(ad) + (12-y)$$
$$CO(ad) \leftrightarrow 3Ru(s) + 12CO(g) \qquad \text{Equation (2)}$$

A decomposition reaction of the Ru$_3$(CO)$_{12}$ gas expressed in Equations (1) and (2) above can be suppressed by the presence of the CO gas, and thus, the film forming material gas can be supplied into the diffusion chamber 54 while maintaining the structure of the Ru$_3$(CO)$_{12}$ to the maximum level. For this reason, the CO gas is used as a carrier gas.

Further, reducing a partial pressure ratio of Ru$_3$(CO)$_{12}$/CO is efficient in order to more effectively suppress the decomposition reaction of the Ru$_3$(CO)$_{12}$ and, for this reason, the CO gas is supplied through the counter CO gas pipe 71, apart from the ruthenium carbonyl gas.

As process conditions at this time, an internal pressure of the processing container ranges from 0.001 to 1 Torr (0.13 to 133 Pa), a wafer temperature is equal to or higher than a decomposition temperature of the film forming material gas, for example, a range of 150 to 250 degrees C. in some embodiments. Further, a flow rate of the CO gas as a carrier gas is set to a flow rate at which a flow rate of the Ru$_3$(CO)$_{12}$ gas as a film forming material becomes 5 mL/min (sccm) or less, e.g., 300 mL/min (sccm) or less in some embodiments.

At this time, the Ru$_3$(CO)$_{12}$ gas as a film forming material gas is diffused to a periphery in the diffusion chamber 54 due to the operation of the baffle plate 51 and discharged downwardly through the gas discharge hole 53 formed on the peripheral portion of the baffle plate 51. Then, the Ru$_3$(CO)$_{12}$ gas flows downward toward the region positioned more radially outward than the circumferential end of the wafer W within the processing space S, while a portion thereof is diffused toward the central portion of the processing space S. Most of the downwardly flowing film forming material gas collides with the orifice forming member 58 that is formed in the lower end portion of the inner partition wall 55 and extends toward the central portion of the processing space S, and is first curved toward the central portion of the processing space S. A portion of the film forming material gas remains within the processing space S, and at the same time, a large amount of film forming material gas flows through the orifice portion 59 having a narrowed flow path area and the gas outlet 56 to a space below the loading table 3 within the processing container 2 and finally is exhausted from the exhaust port 13 through the exhaust space of the exhaust container 12.

Thus, since the orifice portion 59 having an appropriately narrowed exhaust path area is installed, the conductance of the film forming material gas when the gas is exhausted from the processing space S can be reduced such that the film forming material gas can remain within the processing space S for an appropriate period of time. Further, the evacuation of an internal atmosphere of the processing space S can proceed through the orifice portion 59 and the gas outlet 56 while the film forming material gas is not excessively distributed in the central portion of the processing space S. That is, since the residence time of the film forming material gas within the processing space S can be appropriately increased by the presence of the orifice portion 59, in-plane uniformity of the film thickness can be enhanced, while increasing a deposition rate of the Ru film.

However, although the in-plane uniformity of the film thickness can be secured to a certain degree by controlling a flow of the film forming material gas in the processing space S like this, the control of the film forming material gas flow as described above may not be sufficient since a higher level of in-plane uniformity of the film thickness is required in a copper wiring of a more scaled-down semiconductor device after the 22 nm node technology. Particularly, an extremely small film thickness of 2 nm or smaller is required for a Ru film as a base of a copper film in a copper wiring.

That is, in the loading table 3, since only the loading table body 31 having a loading surface is heated by the heater 23 while the radially outwardly positioned members such as the edge ring 35 and the cover ring 44 (hereinafter, referred to as outer members) do not have a heater in order to suppress the thermal decomposition of the film forming material gas and to prevent the formation of film, a temperature difference inevitably occurs therebetween and this prompts a difference in film thicknesses.

For example, when a temperature of the loading table body 31 is set to 195 degrees C., a temperature of the wafer W (central portion) becomes 190 degrees C. while a temperature of the outer members become lower than 180 degrees C., resulting in that an amount of film formation in the peripheral portion of the wafer is smaller than an amount of film formation in the central portion of the wafer due to a lower temperature in the peripheral portion of the wafer, and thus, a film thickness of the Ru film tends to be smaller in the peripheral portion than in the central portion.

Conventionally, such non-uniformity of film thickness due to the temperature difference is not problematic, but recently, in the copper wiring of a more scale-downed semiconductor device, even the non-uniformity of a film thickness due to the temperature difference becomes a problem.

Thus, in the present embodiment, the $H_2$ gas as a heat transfer gas is introduced into the processing container 2, and heat from the heater 23 of the loading table body 31 installed for heating the wafer W of the loading table 3 is transferred to the outer members such as the edge ring 35 and the cover ring 44 positioned outside the loading table body 31 through a $H_2$ gas, thereby increasing the temperature uniformity of the wafer W by making a temperature of the outer members have a temperature value closest to the temperature of the loading table body 31.

The $H_2$ gas has thermal conductivity of 267 mW/(m·K) at 500K (227 degrees C.), and has particularly high thermal conductivity (for example, thermal conductivity of $N_2$ gas is 38.64 mW/(m·K) and that of an Ar gas is 26.58 mW/(m·K), compared with those of other gases, which exhibits extremely higher heat transfer property. The $H_2$ gas used as a heat transfer gas may be solely supplied to the processing container or may be diluted with an $N_2$ gas, or the like.

Further, as described above, the He gas may also be used as a heat transfer gas. Thermal conductivity of the He gas is slightly lower than that of the $H_2$ gas, but the He gas has high thermal conductivity of 221.2 mW/(m·K) at 500K (227 degrees C.) and is effective as a heat transfer gas.

However, when the $H_2$ gas is introduced in a state in which the wafer W is present within the processing container 2, a surface smoothness of the formed film tends to be degraded, and thus, the He gas is introduced into the processing container 2 for previous heating before the wafer W is loaded into the processing container 2 in some embodiments.

The sequence of a specific film forming process at this time will be described with reference to the flowchart of FIG. 4.

First of all, an $H_2$ gas as a heat transfer gas is introduced into the processing container 2 (step S1). At this time, only the $H_2$ gas may be introduced or both the $H_2$ gas and an $N_2$ gas may be introduced. Accordingly, heat from the loading table body 31 is transferred to the outer members through the $H_2$ gas, and after the $H_2$ gas is supplied for a predetermined period of time, the supply of the $H_2$ gas is stopped and the interior of the processing container 2 is evacuated (step S2). Subsequently, the wafer W is loaded into the processing container 2 and loaded on the loading table 3 (step S3), and an $N_2$ gas as a temperature increasing gas is introduced into the processing container 2 to increase a temperature of the wafer W (step S4). And then, a $Ru_3(CO)_{12}$ gas is introduced into the processing container 2 to form a Ru film through CVD (step S5). Thereafter, the interior of the processing container 2 is evacuated (purged) (step S6), and the wafer W is unloaded out of the processing container 2 (step S7). This process is repeatedly performed on a predetermined number of wafers.

At this time, the temperatures of the loading table body 31, the outer members (the edge ring 35, the cover ring 44, etc.) and the wafer change are illustrated in FIG. 5A. Meanwhile, temperature changes in the case of the conventional film forming process without performing pre-heating with the $H_2$ gas, are shown in FIG. 5B. In comparing the two, it can be seen that, in the case where pre-heating was performed with the $H_2$ gas, the temperature of the outer members increased during pre-heating and became close to the temperature value of the wafer when the Ru film is formed as illustrated in FIG. 5A, whereas in the conventional method in which pre-heating with the $H_2$ gas was not performed, the temperature of the outer members did not sufficiently increase during a temperature increasing process after the wafer was loaded and thus, became far lower than that of the wafer when the Ru film was formed as illustrated in FIG. 5B.

Further, even when the He gas is used as a heat transfer gas, the process may be performed in the same order, but since the He gas does not degrade smoothness of the Ru film, the He gas may be introduced in the presence of the wafer W without causing any bad influence. For example, when the temperature of the wafer is increased, the He gas may be introduced as a heat transfer gas, instead of the $N_2$ gas.

<Experimental Example>

Figure 6:
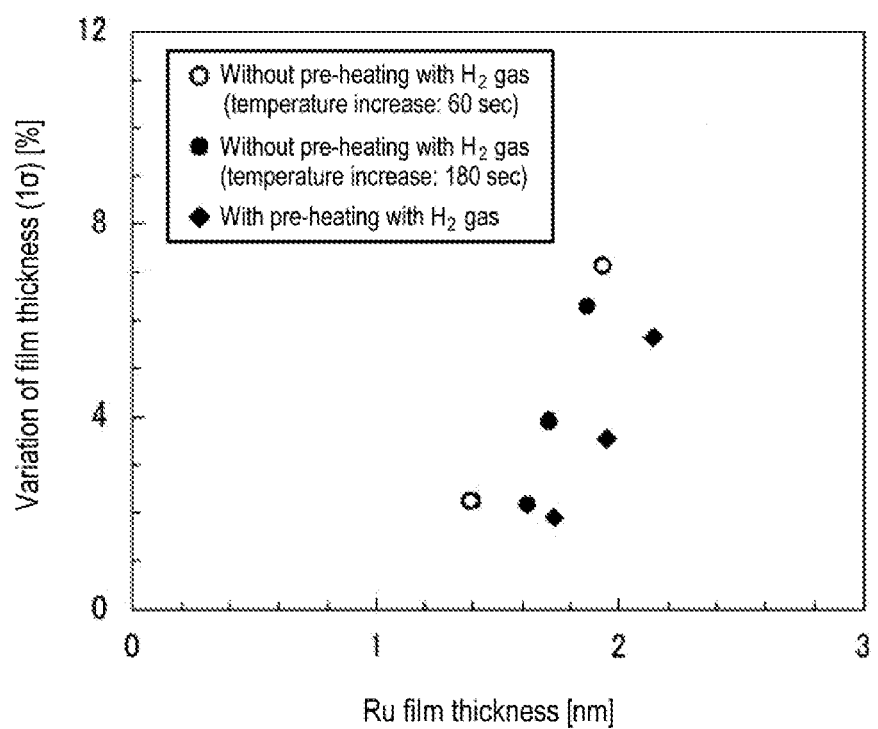
FIG. 6 is a view illustrating variations (1σ) in film thicknesses of a wafer in a diameter direction in a case where the film was pre-heated with a $H_2$ gas and a case where the film was not pre-heated, when film thicknesses of ruthenium (Ru) films were measured in the diameter direction of the wafer after the Ru films were formed to have various film thicknesses through CVD.

First, film thicknesses of the Ru films obtained by the method of the present disclosure in which pre-heating is performed with the $H_2$ gas and the method in which pre-heating is not performed were inspected. Here, by using a silicon wafer having a TaN film and a thermal oxide film as a barrier film on an interlayer insulating film formed by ionized physical vapor deposition (iPVD), Ru films having various film thicknesses were formed through CVD in both a case in which pre-heating was performed with the $H_2$ gas and a case in which pre-heating was not performed, and the film thicknesses were measured in a diameter direction of the wafer. FIG. 6 shows film thickness variations (1σ) in the diameter direction of the wafer. FIG. 6 also shows the results of lengthening a temperature increasing time with the $N_2$ gas from the conventional 60 sec to 180 sec, without performing pre-heating with the $H_2$ gas, in order to confirm the effect of pre-heating with the $H_2$ gas. As illustrated in FIG. 6, it was confirmed that variations of film thicknesses were merely slightly lowered by increasing the temperature increasing time, but definitely lowered by performing pre-heating with the $H_2$ gas.

Figure 7B:
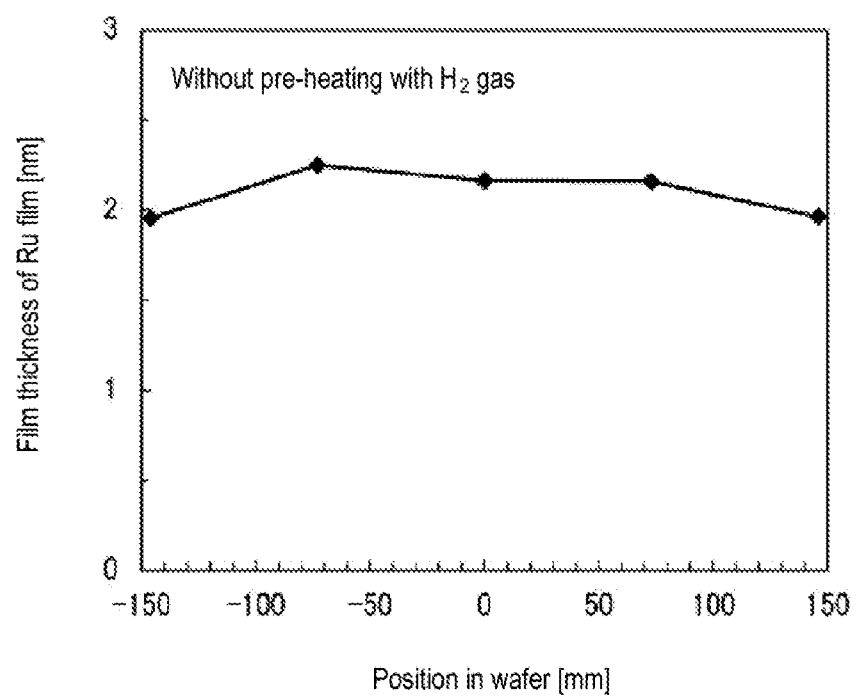

Subsequently, a Ru film used as a seed layer for a copper film was actually formed to have a film thickness of about 2 nm and a film thickness distribution of the wafer in the diameter direction was measured. The results are illustrated in FIGS. 7A and 7B. FIG. 7A shows a case in which pre-heating was performed with the $H_2$ gas and FIG. 7B shows a case in which pre-heating was not performed. As illustrated in FIGS. 7A and 7B, in the conventional method in which pre-heating was not performed with the $H_2$ gas, it can be seen that a film thickness of the peripheral portion of the wafer was reduced. Meanwhile, in the case in which pre-heating was performed with the $H_2$ gas, it can be seen that the film thickness was uniform in the entire surface of the wafer, without showing thinner film thickness in the peripheral portion of the wafer.

The improvement of the film thickness uniformity by performing pre-heating with the $H_2$ gas as illustrated in FIGS. 6, 7A and 7B is considered attributable to the fact that the outer members present outside the wafer were sufficiently heated through the pre-heating with the $H_2$ gas to have its temperature value near to the temperature of the wafer and thus an amount of film formation in the periphery of the wafer becomes substantially equal to that in the central portion of the wafer.

Subsequently, differences in smoothness of the surface of the Ru film depending upon a supply timing of the $H_2$ gas were inspected. Here, by using a silicon wafer having a TaN film and a thermal oxide film as a barrier film on an interlayer insulating film formed by ionized physical vapor deposition (iPVD), film smoothness in a case where a Ru film was formed after pre-heating by introducing the $H_2$ gas was performed prior to loading the wafer and a case where a Ru film was formed after pre-heating by introducing the $H_2$ gas was performed in the presence of the wafer were evaluated. Film smoothness was evaluated with Haze. Haze is an evaluation method using light scattering and a lower Haze value means higher smoothness. For comparison, film smoothness of a case where a Ru film was formed by a conventional method in which the $H_2$ gas is not introduced was also evaluated with Haze.

Figure 9:
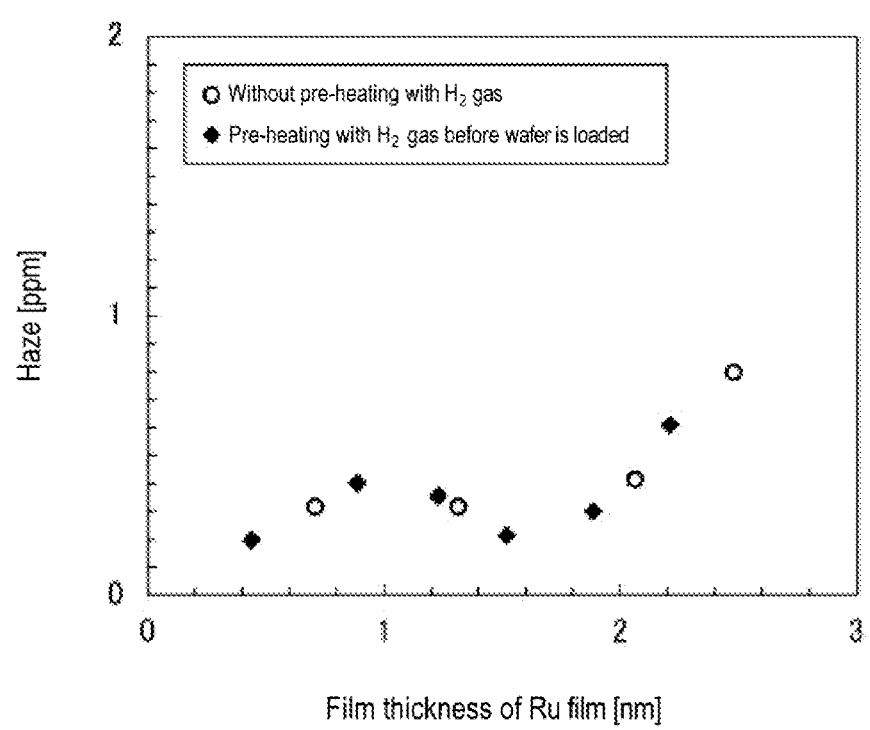
FIG. 9 is a view illustrating a relationship between a film thickness and Haze value of the Ru film in a case where the Ru film was formed by introducing the $H_2$ gas before loading a wafer and in a case using a conventional method without introducing the $H_2$ gas.

The results are illustrated in FIGS. 8 and 9. FIG. 8 shows a relationship between film thickness and Haze value in a case in which a Ru film was formed by introducing the $H_2$ gas in the presence of the wafer and a case in which a Ru film was formed by the conventional method without introducing the $H_2$ gas. FIG. 9 shows a relationship between film thickness and Haze value in a case in which a Ru film was formed by introducing the $H_2$ gas prior to loading the wafer and a case in which a Ru film was formed by the conventional method without introducing the $H_2$ gas. It was confirmed that, as illustrated in FIG. 8, when the $H_2$ gas was introduced in the presence of the wafer, the Haze value tended to increase, compared to the conventional method, whereas, as illustrated in FIG. 9, when the Ru film was formed after the temperature increase by introducing the $H_2$ gas, a Haze value substantially equal to that of the conventional method was obtained. The increase in Haze value (or decrease in Haze value) is considered attributed to the exposure of the TiN film as a base to the $H_2$ gas, and it was confirmed that pre-heating with the $H_2$ gas may be performed before loading the wafer in some embodiments.

<Method of Forming Copper Wiring>

Hereinafter, a method of forming a copper wiring using a Ru film formed as described above will be described.

Figure 10:
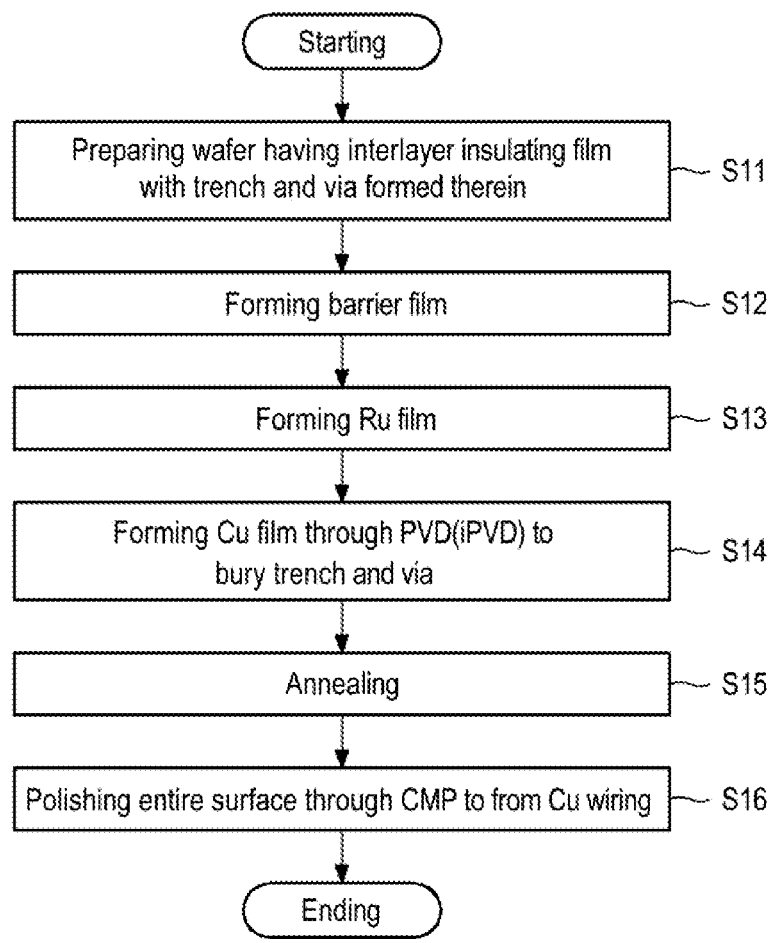
FIG. 10 is a flowchart illustrating a method of forming a copper wiring using a Ru film formed by the film forming method of the present disclosure.

FIG. 10 is a flowchart illustrating a method of forming a copper wiring, and FIGS. 11A to 11F are cross-sectional views illustrating sequential processes of the method.

Figure 11A:
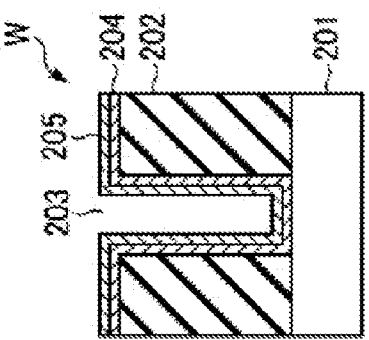
FIGS. 11A to 11F are cross-sectional views illustrating sequential processes of the method of forming a copper wiring using a Ru film formed by the film forming method of the present disclosure.

First, a semiconductor wafer (hereinafter, simply referred to as a wafer) W having an interlayer insulating film 202 such as an $SiO_2$ film, a low-K film (SiCO, SiCOH, etc.) or the like formed on an understructure 201 (details thereof are omitted) is prepared, wherein a trench 203 and a via (not shown) for a connection to a lower layer wiring formed to have a predetermined pattern (step S11, FIG. 11A). As the above-described wafer W, a wafer from which moisture on a surface of the insulating film or residues formed during an etching/ashing process were removed through a degassing process or a pre-clean process, may be preferably used in some embodiments.

Figure 11B:
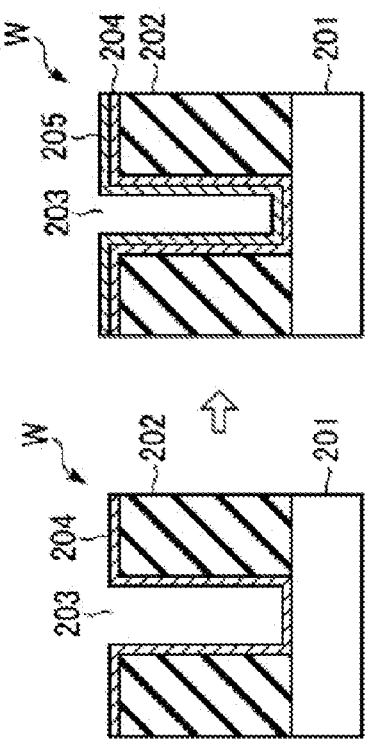

Subsequently, a barrier film 204 that suppresses diffusion of copper is formed on the entire surface including the trench 203 and the via (step S12, FIG. 11B).

As the barrier film 204, a barrier film having high barrier property against copper and low resistance is preferably used in some embodiments, and a Ti film, a TiN film, a Ta film, a TaN film, and a two-layered film of Ta/TaN may be appropriately used. Further, a TaCN film, a W film, a WN film, a WCN film, a Zr film, a ZrN film, a V film, a VN film, an Nb film, an NbN film, or the like may also be used. A copper wiring has lower resistance as the volume of copper buried in the trench or the hole increases. Thus, the barrier film may be formed to be very thin and in this point of view, a thickness thereof preferably ranges from 1 to 20 nm in some embodiments. In some embodiments, the thickness ranges from 1 to 10 nm. The barrier film may be formed through iPVD, for example, plasma sputtering. Further, the barrier film may be formed through other PVD such as normal sputtering, or ion plating, and may be formed through CVD or ALD, or CVD or ALD using plasma.

Figure 11C:
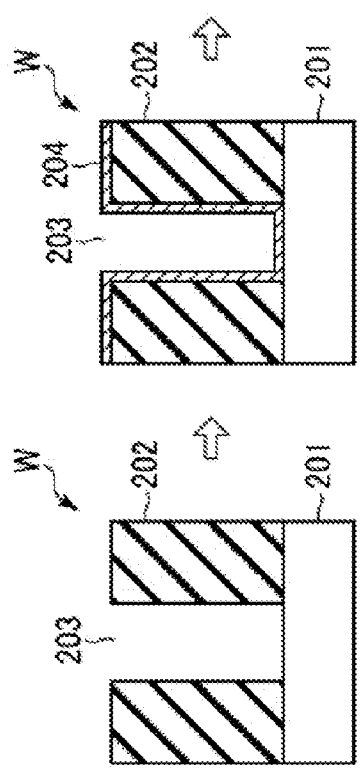

Subsequently, a Ru film 205 is formed as a linear film on the barrier film 204 through CVD using the aforementioned ruthenium carbonyl ($Ru_3(CO)_{12}$) (step S13, FIG. 11C). In some embodiments, the Ru film is formed to be thin, e.g., ranging from 1 to 5 nm, in order to form a wiring with low resistance by increasing the volume of buried copper.

Ru has high wettability to copper. If the Ru is formed as a base for copper, good mobility of copper can be secured when a copper film is formed through iPVD in a next process, thus restraining generation of overhang which blocks the region of the trench or the hole. Further, as described above, by performing pre-heating with the heat transfer gas such as a $H_2$ gas, heat of the loading table body with the heater buried therein can be supplied to the outer members. Thus, even though a required film thickness of the Ru film has an extremely thin level of 2 nm due to scaling-down of the copper wiring, high in-plane uniformity of a film thickness can be maintained.

Figure 11D:
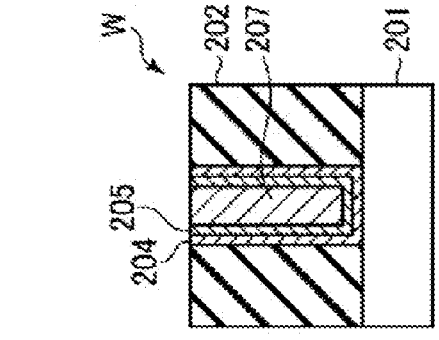

Subsequently, a copper film 206 is formed through PVD to be buried in the trench 203 and the via (not shown) (step S14, FIG. 11D). As PVD, iPVD is preferably used in some embodiments. Accordingly, overhang of copper can be suppressed and thus good buriability is obtained. Also, since PVD is used, a copper film having high purity can be obtained, compared to plating. In some embodiments, it is preferable to form the copper film 206 such that the copper film 206 has an increased portion above the trench 203, in preparation for following planarization processing. However, the increased portion may be formed through plating, instead of being continuously formed through PVD.

Figure 11E:
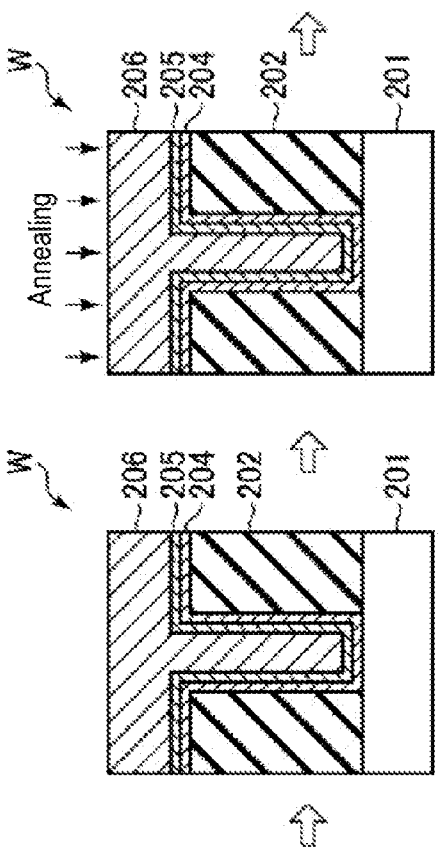

After the copper film 206 is formed, an annealing process is performed as necessary (step S15, FIG. 11E). The copper film 206 is stabilized through the annealing process.

Figure 11F:
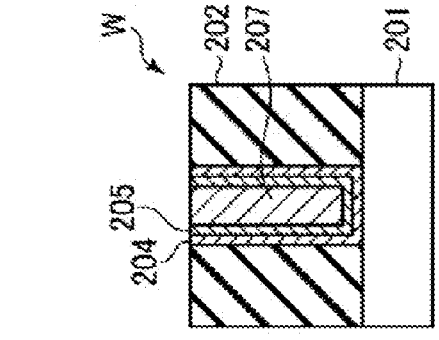

Thereafter, the entire surface of the wafer W is polished through chemical mechanical polishing (CMP) to remove and planarize the copper film 206 present on the surface and the underlying Ru film 205 and barrier film 204 (step S16, FIG. 11F). Accordingly, a copper wiring 207 is formed within the trench and the via (hole).

Further, after forming the copper wiring 207, an appropriate cap film such as a dielectric cap or a metal cap is formed on the entire surface including the copper wiring 207 and the interlayer insulating film 202 on the surface of the wafer W.

Since the Ru film can be formed with respect to the extremely fine trench or hole with high step coverage through the foregoing method, the copper film can be buried without generating a void. Moreover, since the Ru film may be formed with high step coverage, the Ru film can be formed to be extremely thin and thus the volume of copper of the copper wiring can be increased more to allow the copper wiring to have even lower resistance. In addition, since CVD is used to bury copper, a crystal grain of copper can be increased and this can also result in a copper wiring having even further low resistance.

<Film Forming System for Forming Copper Wiring>

Subsequently, a film forming system appropriate for the method of forming a copper wiring will be described.

Figure 12:
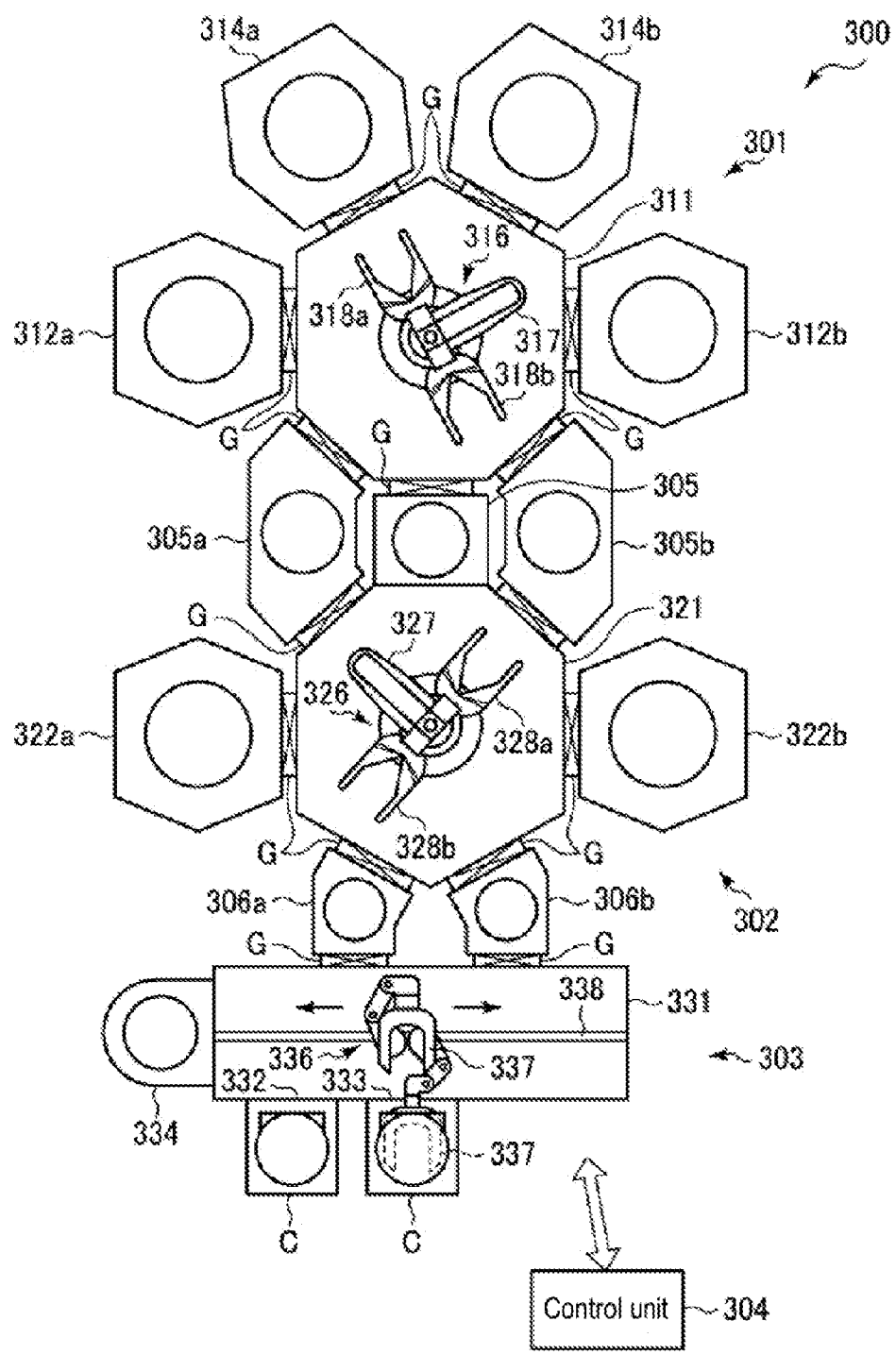
FIG. 12 is a plan view illustrating an example of a film forming system used in the method of forming a copper wiring.

FIG. 12 is a plan view illustrating an example of a film forming system used for the method of forming a copper wiring.

A film forming system 300 includes a first processing unit 301 for forming a barrier film and a Ru film, a second processing unit 302 for forming a copper film, a loading/unloading unit 303, and a control unit 304, and forms a copper film and a base film when a copper wiring is formed on the wafer W.

The first processing unit 301 includes a first vacuum transfer chamber 311, two barrier film forming apparatuses 312a and 312b connected to wall portions of the first vacuum transfer chamber 311, and two Ru film forming apparatuses 314a and 314b. The Ru film forming apparatuses 314a and 314b are configured the same as that of the film forming apparatus 1 described above. The barrier film forming apparatus 312b and the Ru film forming apparatus 314b are positioned line-symmetric with the barrier film forming apparatus 312a and the Ru film forming apparatus 314a, respectively.

Degassing chambers 305a and 305b configured to perform a degassing process of the wafer W are connected to other wall portions of the first vacuum transfer chamber 311. Further, a transfer chamber 305 configured to perform a transfer of the wafer W is connected to wall portions between the degassing chambers 305a and 305b of the first vacuum transfer chamber 311 to transmit the wafer W between the first vacuum transfer chamber 311 and a second vacuum transfer chamber 321 described later.

The barrier film forming apparatuses 312a and 312b, the Ru film forming apparatuses 314a and 314b, the degassing chambers 305a and 305b, and the transfer chamber 305 are connected to sides of the first vacuum transfer chamber 311 through gate valves G, respectively, and they communicate with or are shut off from the first vacuum transfer chamber 311 depending on opening and closing of the corresponding gate values G.

The interior of the first vacuum transfer chamber 311 is maintained under a predetermined vacuum atmosphere, and a first transfer unit 316 for transferring the wafer W is installed therein. The first transfer unit 316 is disposed substantially in the center of the first vacuum transfer chamber 311 and has a rotary flexible portion 317 which is rotatable, and extensible and contractible, and two support arms 318a and 318b supporting the wafer W installed on a front end thereof. The first transfer unit 316 loads and unloads the wafer W with respect to the barrier film forming apparatuses 312a and 312b, the Ru film forming apparatuses 314a and 314b, the degassing chambers 305a and 305b, and the transfer chamber 305.

The second processing unit 302 has the second vacuum transfer chamber 321, and two copper film forming apparatuses 322a and 322b connected to facing wall portions of the second vacuum transfer chamber 321. The copper film forming apparatuses 322a and 322b may be used as an apparatus for performing both burying of a concave portion and forming of the increased portion, or the copper film forming apparatuses 322a and 322b may be used only for burying while the increased portion is formed through plating.

The degassing chambers 305a and 305b are connected to two wall portions of the second vacuum transfer chamber 321 at the first processing unit 301 side, respectively, and the transfer chamber 305 is connected to a wall portion between the degassing chambers 305a and 305b. That is, both the degassing chambers 305a and 305b, and the transfer chamber 305 are installed between the first vacuum transfer chamber 311 and the second vacuum transfer chamber 321, and the degassing chambers 305a and 305b are disposed on both sides of the transfer chamber 305. Also, load lock chambers 306a and 306b available for standby transfer and vacuum transfer, respectively, are connected to two wall portions of the second vacuum transfer chamber 321 at a side of the loading/unloading unit 303.

The copper film forming apparatuses 322a and 322b, the degassing chambers 305a and 305b, and the load lock chambers 306a and 306b are connected to the wall portions of the second vacuum chamber 321 through the gate valves G. When the corresponding gate vales are open, the copper film forming apparatuses 322a and 322b, the degassing chambers 305a and 305b, and the load lock chambers 306a and 306b communicate with the second vacuum transfer chamber 321, and when the corresponding gate valves G are closed, the copper film forming apparatuses 322a and 322b, the degassing chambers 305a and 305b, and the load lock chambers 306a and 306b are shut off from the second vacuum transfer chamber 321. Also, the transfer chamber 305 is connected to the second transfer chamber 321 without a gate valve.

The interior of the second vacuum transfer chamber 321 is maintained under a vacuum atmosphere, and a second transfer unit 326 for loading and unloading the wafer W with respect to the copper film forming apparatuses 322a and 322b, the degassing chambers 305a and 305b, the load lock chambers 306a and 306b, and the transfer chamber 305 is installed in the second vacuum transfer chamber 321. The second transfer unit 326 is disposed in the substantially center of the second vacuum transfer chamber 321 and has a rotary flexible portion 327 that is rotatable, and extensible and contractible. Two support arms 328a and 328b supporting the wafer W are installed on a front end of the rotary flexible portion 327 such that the two support arms 328a and 328b face opposite direction.

The loading/unloading unit 303 is installed on the opposite side of the second processing unit 302 with the load lock chambers 306a and 306b interposed therebetween, and includes a standby transfer chamber 331 connected to the load lock chambers 306a and 306b. A filter (not shown) for forming a down flow of clean air is installed above the standby transfer chamber 331. Gate vales G are installed on wall portions between the load lock chambers 306a and 306b, and the standby transfer chamber 331. Two connection ports 332 and 333 are installed on wall portions opposite the wall portions of the standby transfer chamber 331 to which the load lock chambers 306a and 306b are connected, to connect to carriers C that accommodate the wafer W as a substrate to be processed (hereinafter, referred to as target substrate). Further, an alignment chamber 334 configured to perform alignment of the wafer W is installed on a lateral side of the standby transfer chamber 331. A transfer unit 336 for standby transfer is installed within the standby transfer chamber 331 in order to load and unload the wafer W with respect to the carriers C and the load lock chambers 306a and 306b. The transfer unit 336 for standby transfer has two multi-joint arms and is able to travel on a rail 338 along a direction in which the carriers C are arranged. Thus, the transfer unit 336 for standby transfer transfers the wafer W put on a hand 337 of each front end.

The control unit 304 controls each component of the film forming system 300, for example, the barrier film forming apparatuses 312a and 312b, the Ru film forming apparatuses 314a and 314b, the copper film forming apparatuses 322a and 322b, the transfer units 316, 326, and 336, and the like, and serve as a higher control device for controllers (not shown) (e.g., the controller 7) each of which controls an individual component. The control unit 304 has a process controller configured as a microprocessor (computer) for controlling each component, a user interface for input manipulation or an operative situation monitoring by an operator to manage the film forming system 300, and a storage unit that stores a process recipe for executing processing on each component of a processing device based on various data and process conditions, or any other control data. The process recipe is stored in a storage medium (a hard disk, a CD-ROM, a DVD, a flash memory, or the like) of the storage unit. A recipe may be appropriately transmitted from another device, e.g., through a dedicated line.

Further, if necessary, a certain recipe may be retrieved from the storage unit by an instruction via the user interface, or the like, to be executed by the process controller, whereby a desired process is performed in the film forming system 300 under the control of the process controller.

In the film forming system 300 described above, the wafer W with a predetermined pattern having a trench or a hole formed thereon is extracted from the carriers C by the transfer unit 336 for standby transfer and is transferred to the load lock chamber 306a or 306b. The load lock chamber is depressurized to a degree of vacuum equal to that of the second vacuum transfer chamber 321. After that, the wafer W in the load lock chamber is transferred to the degassing chamber 305a or 305b through the second vacuum transfer chamber 321 by the second transfer unit 326, and then, the wafer W is degassed. Thereafter, the wafer W in the degassing chamber is extracted by the first transfer unit 316 and loaded to the barrier film forming apparatus 312a or 312b through the first vacuum transfer chamber 311, to form a barrier film. After the barrier film is formed, the wafer W is extracted from the barrier film forming apparatus 312a or 312b by the first transfer unit 316 and is loaded to the Ru film forming apparatus 314a or 314b, to form a Ru film as described above. After the Ru film is formed, the wafer W is extracted from the Ru film forming apparatus 314a or 314b by the first transfer unit 316 and transferred to the transfer chamber 305. Thereafter, the wafer W is extracted by the second transfer unit 326 and loaded to the copper film forming apparatus 322a or 322b through the second vacuum transfer chamber 321 to form a copper film, while burying copper in a trench and via. Although the forming of the copper film at this time may include forming the increased portion, the copper film forming apparatus 322a or 322b may perform only burying and the increased portion may be formed through plating.

After the copper film is formed, the wafer W is transferred to the load lock chamber 306a or 306b, and then the load lock chamber is returned to an atmospheric pressure. After that, the wafer W with the copper film formed thereon is extracted by the transfer unit 336 for standby transfer, and returned to the carriers C. This process is repeated by the number of the wafers W within the carriers.

By using this film forming system 300, the barrier film, the Ru film and the copper film may be formed in a vacuum environment without being opened to the air. Therefore, since oxidation on the surfaces after each process can be prevented, a high performance copper wiring can be obtained.

The film forming system 300 described above may perform the barrier film forming to the copper film forming in the foregoing embodiment, but an annealing process and a CMP process that are performed after the copper film forming may be performed by using a separate device on the wafer W transferred out of the film forming system 300. This device may be one having a normally used configuration. If this device and the film forming system 300 constitute a copper wiring forming system and a common control unit having the same function as that of the control unit 304 controls both the device and the film forming system 300, a copper wiring forming method according to another embodiment may be controlled by a single process recipe in a lump.
<Other Application>

While the embodiment of the present disclosure has been described above, the present disclosure is not limited to the foregoing embodiment and may be variously modified. For example, in the foregoing embodiment, using the Ru film as a base film for the copper film in forming the copper wiring has been described as an example, but the present disclosure is not limited thereto. Further, in the foregoing embodiment, using the $Ru_3(CO)_{12}$ gas for forming the Ru film has been described as an example, but any film forming material gas may be applied in terms of the principal of the present disclosure as long as a film is formed by thermal decomposition or thermal reaction of the film forming material gas. The film being formed is not limited to the Ru film. Various metal carbonyls may be used as a film forming material gas depending on film materials, and various film forming material gases, without being limited to the metal carbonyl, may be used. Moreover, in the foregoing embodiment, the case in which the $Ru_3(CO)_{12}$ gas as a metal carbonyl gas is thermally decomposed has been illustrated, but the present disclosure may also be applied to a case in which a film forming material gas reacts with other gases to form a predetermined film.

Further, in the afore-mentioned embodiment, the example of applying the method of the present disclosure to the wafer having a trench and a via (hole) has been illustrated, but the shape of a concave portion is not limited to the inclusion of both the trench and via. In addition, the structure of the applied device is not also limited to the foregoing embodiment and a substrate is not limited to a semiconductor wafer.

Moreover, in the foregoing embodiment, a description is made on the film forming apparatus in which the baffle plate having gas discharge holes positioned corresponding to a region positioned radially outwardly than the peripheral portion of the substrate is used to allow a film forming material to be evenly supplied to the peripheral portion and the central portion of the substrate, and the partition wall is installed to surround the processing space S to control a flow of the film forming material. However, the present disclosure is not limited thereto and may be applied to a film forming apparatus in which a film thickness is not uniform due to a temperature of an outer member of the substrate decreased to be lower than that of the substrate, even when the film forming apparatus uses another gas introduction unit, e.g., discharging a film forming material gas using a normal shower head for discharging a gas in a shower manner to a substrate.

According to the present disclosure, in a state in which a target substrate is loaded on the loading table body of the loading table installed in the processing container and the interior of the processing container is evacuated, a film forming material gas is supplied into the processing container while heating the target substrate with the heater installed in the loading table body. The supplied film forming material gas is thermally decomposed or reacted on the surface of the target substrate to form a predetermined film on the target substrate. At this time, before the film forming material gas is supplied, a heat transfer gas containing an $H_2$ gas or an He gas is introduced into the processing container to transfer heat of the loading table body to a radially outer side of the loading table body. Accordingly, the outer side of the loading table body is allowed to have a temperature closest to the temperature of the loading table body, thereby increasing temperature uniformity of the target substrate and forming a film having extremely high in-plane uniformity of the thickness on the target substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method in which in a state in which a target substrate is loaded on a loading table body of a loading table installed in a processing container and an interior of the processing container is evacuated, a film forming material gas is supplied into the processing container while heating the target substrate with a heater installed in the loading table body, to be thermally decomposed or reacted on a surface of the target substrate to form a predetermined film on the target substrate, the method comprising:

heating the loading table body with the heater; and introducing a heat transfer gas containing an $H_2$ gas or an He gas into the processing container and increasing a temperature of the heat transfer gas based on to transfer heat of the heated loading table body, the heat transfer gas flowing to a radially outer side of the loading table body, before the film forming material gas is supplied.

2. The method of claim 1, wherein the loading table comprises an outer member having a temperature set to be lower than that of the target substrate in the radially outer side of the loading table body.

3. The method of claim 1, wherein, before the target substrate is loaded to the processing container, the heat transfer gas is introduced into the processing container to transfer heat of the loading table body to the radially outer side of the loading table body and then is exhausted from the processing container, and after that, the target substrate is loaded on the loading table in the processing container for a film forming process.

4. The method of claim 3, wherein, after the target substrate is loaded on the loading table in the processing container, a temperature increasing gas is introduced into the processing container to increase a temperature of the target substrate, and the film forming process is then performed thereon.

5. The method of claim 1, wherein a $Ru_3(CO)_{12}$ gas is used as the film forming material gas and is thermally decomposed to form a ruthenium film as the predetermined film.

6. The method of claim 5, wherein the ruthenium film as the predetermined film is used as a base for a copper film in forming a copper wiring.

7. The method of claim 1, wherein an orifice forming member having a ring shape is installed along a circumferential direction of the loading table and extends toward a center of the processing container, and an orifice portion is formed between a lower surface of the orifice forming member and a peripheral portion of the loading table to communicate with a gas outlet, and wherein the heat transfer gas flows to a radially outer side of the loading table body and is exhausted through the orifice portion.

8. A non-transitory computer-readable recording medium storing a program that operates on a computer to control a film forming apparatus, wherein, when executed, the program controls the firm forming apparatus on the computer such that the method of claim 1 is performed.

* * * * *